(12) United States Patent
Tetani et al.

(10) Patent No.: US 7,514,802 B2
(45) Date of Patent: Apr. 7, 2009

(54) WIRING BOARD

(75) Inventors: Michinari Tetani, Osaka (JP); Takayuki Tanaka, Osaka (JP); Hiroyuki Imamura, Osaka (JP); Nozomi Shimoishizaka, Kyoto (JP); Kouichi Nagao, Kyoto (JP)

(73) Assignee: Panasonic Corporation, Osaka (JP)

( * ) Notice: Subject to any disclaimer, the term of this patent is extended or adjusted under 35 U.S.C. 154(b) by 160 days.

(21) Appl. No.: 11/531,381

(22) Filed: Sep. 13, 2006

(65) Prior Publication Data

US 2007/0075426 A1 Apr. 5, 2007

(30) Foreign Application Priority Data

Sep. 30, 2005 (JP) ............................. 2005-287853

(51) Int. Cl.
*H01L 23/544* (2006.01)
(52) U.S. Cl. .................. 257/797; 438/400; 438/401; 438/462
(58) Field of Classification Search ................ 257/797; 438/400, 401, 462
See application file for complete search history.

(56) References Cited

U.S. PATENT DOCUMENTS

| 6,281,450 B1 * | 8/2001 | Urasaki et al. ............. 174/261 |
| 7,307,349 B2 * | 12/2007 | Hikita et al. ................ 257/778 |
| 2004/0212969 A1 | 10/2004 | Imamura et al. | |

2005/0064627 A1   3/2005   Kimura et al.

FOREIGN PATENT DOCUMENTS

| JP | 10-12661 | 1/1998 |
| JP | 2004-327936 | 11/2004 |
| JP | 2005-093839 | 4/2005 |

OTHER PUBLICATIONS

Japanese Office Action from the corresponding JP2005-287853, mailed Sep. 25, 2007.

* cited by examiner

*Primary Examiner*—Jasmine J Clark
(74) *Attorney, Agent, or Firm*—Hamre, Schumann, Mueller & Larson, P.C.

(57) ABSTRACT

A flexible insulating base, a plurality of conductor wirings aligned on the flexible insulating base, and bump electrodes provided respectively in end portions of the plurality of conductor wirings in a region where a semiconductor chip is to be placed are provided. The semiconductor chip is mounted on the conductor wirings by bonding electrode pads formed on the semiconductor chip to the bump electrodes. An auxiliary conductor wiring formed similarly to the conductor wirings is provided on the insulating base, and an auxiliary bump electrode formed similarly to the bump electrodes is provided on the auxiliary conductor wiring, so that the electrode pads formed on the semiconductor chip can be registered with respect to the bump electrodes on the conductor wirings by positioning the semiconductor chip with reference to the auxiliary bump electrode. It is possible to configure a wiring board having register marks capable of positioning electrode pads of a semiconductor chip with respect to bump electrodes with high accuracy.

16 Claims, 4 Drawing Sheets

WIRING BOARD

BACKGROUND OF THE INVENTION

1. Field of the Invention

The present invention relates to a wiring board having a configuration in which conductor wirings are provided on a flexible insulating base such as a tape carrier substrate, for example, and bump electrodes for connection are formed on these conductor wirings.

2. Description of Related Art

As one type of package modules using a tape carrier substrate, a COF (Chip On Film) package module has been known. The COF package module has a structure in which a semiconductor chip is mounted on a tape carrier substrate and the mounting portion is protected by sealing with a resin. The tape carrier substrate used in the COF includes an insulating film base and a large number of conductor wirings formed on a surface of the film base. In general, polyimide is used for the film base, and copper is used for the conductor wirings. A metal plating film and a layer of solder resist, which is an insulating resin, are formed on the conductor wirings as needed. The conductor wirings on the tape carrier substrate and electrode pads on the semiconductor chip are connected via bump electrodes. JP 2004-327936 A discloses a tape carrier substrate in which these bump electrodes are formed on the conductor wirings in advance.

In order to mount a semiconductor chip on the above-described tape carrier substrate, the electrode pads on the semiconductor chip and the bump electrodes have to be positioned with respect to each other when placing the semiconductor chip on the tape carrier substrate.

FIG. 6 illustrates an example of the tape carrier substrate having register marks for such positioning. In FIG. 6, numeral 1 denotes an insulating film base, on which a large number of conductor wirings 2 are aligned. Each end portion of the conductor wirings 2 is provided with a bump electrode 3. A semiconductor chip 4 to be mounted is indicated by an alternate long and short dashed line. A large number of electrode pads (not shown) formed on the semiconductor chip 4 are opposed and bonded to the bump electrodes 3, respectively.

On an upper surface of the film base 1, a solder resist layer 5 formed of, for example, an epoxy resin is provided and serves as a coating film for protecting the conductor wirings 2. The solder resist layer 5 is provided with a chip mounting portion opening 5a whose perimeter edge is located on the periphery of a region in which the semiconductor chip 4 is to be mounted. The end portions of the conductor wirings 2 provided with the bump electrodes 3 are disposed so as to be exposed inside the chip mounting portion opening 5a for connection with the electrode pads of the semiconductor chip 4.

Both edge portions of the film base 1 are provided with sprocket holes 6, which are used for moving the film base 1 in a process step of mounting the semiconductor chip 4. When mounting the semiconductor chip 4, the electrode pads of the semiconductor chip 4 and the bump electrodes 3 of the conductor wirings 2 have to be in register with each other. Thus, register marks 7 are provided on an upper surface of a semiconductor substrate of the semiconductor chip 4. The film base 1 also is provided with register marks 8 at positions corresponding to the register marks 7. The register marks 8 are provided by forming a wiring layer similar to the conductor wiring 2 into a shape of the mark, and exposed from the solder resist layer 5.

When mounting the semiconductor chip 4 on the film base 1, with reference to the register marks 7 of the semiconductor chip 4 and the register marks 8 of the film base 1, the semiconductor chip 4 is positioned so that both the register marks 7 and the register marks 8 are in a predetermined positional relationship. In this way, the electrode pads of the semiconductor chip 4 and the bump electrodes 3 of the conductor wirings 2 are opposed to each other in a bondable state.

However, in the conventional registration method described above, with a decrease in the pitch between the conductor wirings 2 and in the size of the bump electrodes 3, it has become difficult to register the electrode pads of the semiconductor chip 4 and the bump electrodes 3 of the conductor wirings 2 with the necessary accuracy. The reason follows.

Since the register marks 8 of the film base 1 are formed similarly to the conductor wirings 2, they are formed in a different step from the bump electrodes 3. Accordingly, a certain error is caused inevitably in the positional relationship between the register marks 8 and the bump electrodes 3. As a result, when positioning the semiconductor chip 4 with reference to the register marks 7 of the semiconductor chip 4 and the register marks 8 of the film base 1, there is a slight error in the positional relationship of the electrode pads of the semiconductor chip 4 with respect to the bump electrodes 3, making it difficult to secure a sufficient connection reliability.

SUMMARY OF THE INVENTION

It is an object of the present invention to provide a wiring board having register marks capable of positioning electrode pads of a semiconductor chip with respect to bump electrodes with high accuracy.

A wiring board according to the present invention includes a flexible insulating base, a plurality of conductor wirings aligned on the flexible insulating base, and bump electrodes provided respectively at end portions of the plurality of conductor wirings in a region where a semiconductor chip is to be placed, and is configured so that the semiconductor chip is mounted on the conductor wirings by bonding electrode pads formed on the semiconductor chip to the bump electrodes.

In order to solve the above-mentioned problem, in the wiring board according to the present invention, an auxiliary conductor wiring formed similarly to the conductor wirings is provided on the insulating base, and an auxiliary bump electrode formed similarly to the bump electrodes is provided on the auxiliary conductor wiring, so that the electrode pads formed on the semiconductor chip can be registered with respect to the bump electrodes on the conductor wirings by positioning the semiconductor chip with reference to the auxiliary bump electrode.

DETAILED DESCRIPTION OF THE INVENTION

Figure 1:
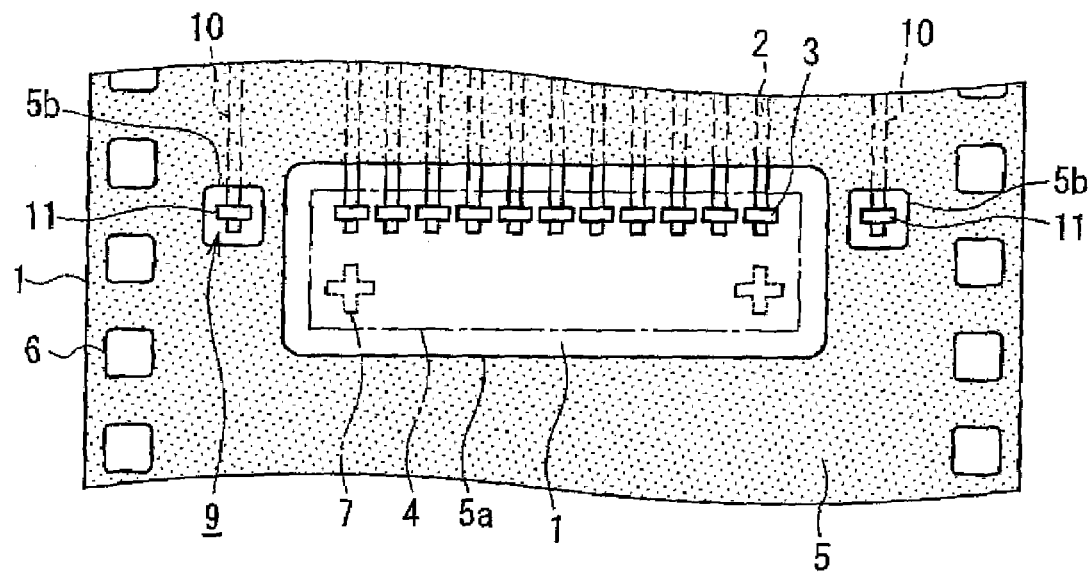
FIG. 1 is a plan view showing part of a wiring board according to Embodiment 1 of the present invention.

In the wiring board according to the present invention, an auxiliary conductor wiring formed similarly to the conductor wirings is provided on the insulating base, and an auxiliary bump electrode is provided on the auxiliary conductor wiring, so that the semiconductor chip can be positioned with reference to the auxiliary bump electrode. By the positioning with reference to the auxiliary bump electrode, which is in a highly-accurate positional relationship with the bump electrodes, it becomes possible to position the electrode pads on the semiconductor chip with respect to the bump electrodes with high accuracy.

In the wiring board according to the present invention, it is preferable that the bump electrodes and the auxiliary bump electrode have equal heights. It also is preferable that a material of the bump electrodes and a material of the auxiliary bump electrode are the same. Further, it is preferable that the bump electrodes and the auxiliary bump electrode are formed simultaneously.

Moreover, it is preferable further to include a solder resist layer formed by coating the insulating base including the conductor wirings and the auxiliary conductor wiring, and the solder resist layer preferably has a register opening in en end region of the auxiliary conductor wiring where the auxiliary bump electrode is formed, and the auxiliary bump electrode preferably is exposed from the register opening.

With this configuration, the auxiliary bump electrode preferably is disposed in an outer region spaced away from a region where the bump electrode is disposed.

Further, it is preferable that a plurality of the auxiliary conductor wirings are arranged in parallel, the auxiliary bump electrodes are formed respectively on the plurality of the auxiliary conductor wirings so as to be aligned in parallel with each other, and the auxiliary bump electrodes that are adjacent to each other are joined.

Alternatively, it is preferable that a plurality of the auxiliary conductor wirings are arranged in parallel, the auxiliary bump electrodes are formed respectively on the plurality of the auxiliary conductor wirings so as to be aligned in parallel with each other, and the auxiliary bump electrodes that are adjacent to each other are spaced away.

With the above-described configuration, another group of a plurality of auxiliary bump electrodes can be provided on the plurality of the auxiliary conductor wirings so as to be aligned in series with the auxiliary bump electrodes that are aligned in parallel.

Alternatively, the plurality of the auxiliary conductor wirings can be combined into a single auxiliary conductor wiring in regions on both sides of the auxiliary bump electrodes, and a portion of the combination can be located inside the register opening.

Alternatively, at least part of the plurality of the auxiliary conductor wirings can have an oblique crossing portion in which they cross a perimeter edge of the register opening obliquely.

Hereinafter, embodiments of the present invention will be described more in detail with reference to the accompanying drawings.

Embodiment 1

Figure 6:
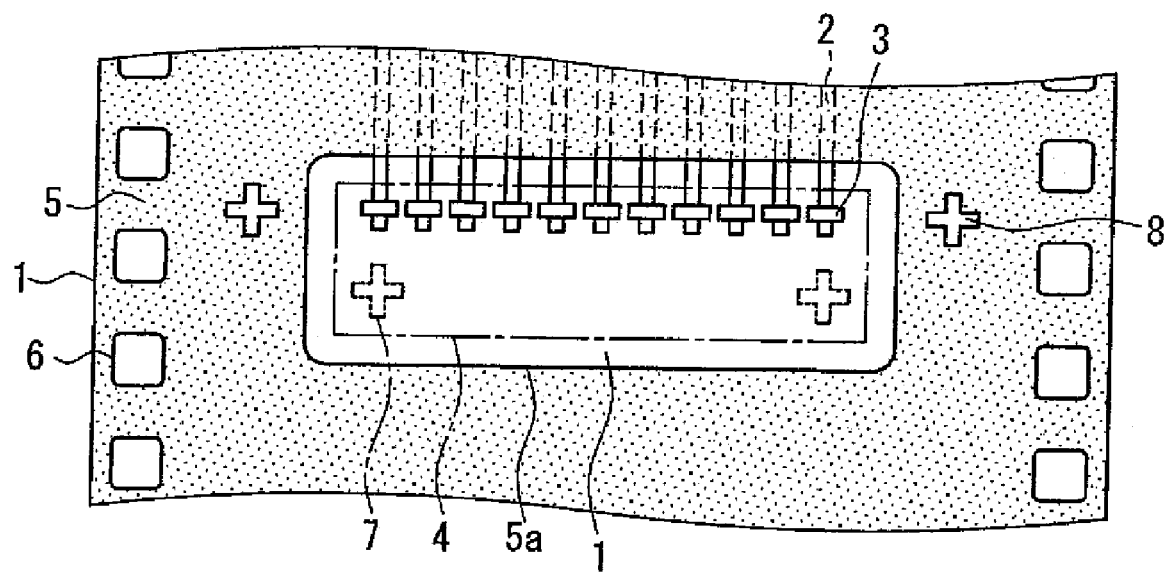
FIG. 6 is a plan view showing part of a wiring board in a conventional example.

FIG. 1 is a plan view showing a wiring board according to Embodiment 1 of the present invention. In the present embodiment, the same elements as those in the wiring board in the conventional example shown in FIG. 6 are assigned the same reference numerals in the following description. As shown in FIG. 1, a large number of conductor wirings 2 are aligned on an insulating film base 1. Each end portion of the conductor wirings 2 is provided with a bump electrode 3. A semiconductor chip 4 to be mounted is indicated by an alternate long and short dashed line. A large number of electrode pads (not shown) formed on the semiconductor chip 4 are opposed and bonded to the bump electrodes 3, respectively.

On an upper surface of the film base 1, a solder resist layer 5 formed of, for example, an epoxy resin is provided and serves as a coating film for protecting the conductor wirings 2. The solder resist layer 5 is provided with a chip mounting portion opening 5a whose perimeter edge is located on the periphery of a region in which the semiconductor chip 4 is to be mounted. The end portions of the conductor wirings 2 provided with the bump electrodes 3 are disposed so as to be exposed inside the chip mounting portion opening 5a for connection with the electrode pads of the semiconductor chip 4.

Both edge portions of the film base 1 are provided with sprocket holes 6, which are used for moving the film base 1 in a process step of mounting the semiconductor chip 4. When mounting the semiconductor chip 4, the electrode pads of the semiconductor chip 4 and the bump electrodes 3 of the conductor wirings 2 have to be in register with each other. Thus, register marks 7 are provided on an upper surface of a semiconductor substrate of the semiconductor chip 4. The film base 1 also is provided with register marks 9 at positions having a predetermined relation to the register marks 7. The register mark 9 includes an auxiliary conductor wiring 10 formed on the film base 1 similarly to the conductor wiring 2 and an auxiliary bump electrode 11 formed on the auxiliary conductor wiring 10 similarly to the bump electrode 3. The solder resist layer 5 is provided with a register mark opening 5b so as to expose the auxiliary bump electrode 11. The auxiliary bump electrode 11 and its surrounding region are exposed from the register mark opening 5b.

When mounting the semiconductor chip 4 on the film base 1, the semiconductor chip 4 is positioned with reference to a positional relationship between the register marks 7 of the semiconductor chip 4 and the auxiliary bump electrodes 11 of the film base 1. In this way, the electrode pads of the semiconductor chip 4 and the bump electrodes 3 of the conductor wirings 2 are opposed to each other in a bondable state. The auxiliary bump electrode 11 can be formed in the same step as the bump electrode 3. Thus, by positioning the semiconductor chip 4 so that the register marks 7 of the semiconductor chip 4 and the auxiliary bump electrodes 11 of the film base 1 are in a predetermined positional relationship, the electrode pads of the semiconductor chip 4 can be registered with an accuracy similar to the case of registering the semiconductor chip 4 with respect to the bump electrodes 3 directly, making it possible to secure a sufficient connection reliability.

Since the auxiliary bump electrode 11 is used for the registration of the semiconductor chip 4, it has to be disposed outside a region in which the semiconductor chip 4 is to be mounted. However, it is not always necessary that the register mark opening 5b should be formed separately from the chip mounting portion opening 5a as shown in FIG. 1. The auxiliary bump electrode 11 may be disposed close to a region in which the bump electrodes 3 are disposed, and the register mark opening 5b may be integrated with the chip mounting portion opening 5a.

The bump electrodes 3 and the auxiliary bump electrode 11 are formed so as to have equal heights. Also, it is desired that the bump electrodes 3 and the auxiliary bump electrode 11 are formed of the same material. Although it is desired that the bump electrodes 3 and the auxiliary bump electrode 11 are formed simultaneously in the same step, they also can be formed in different steps as long as their positional relationship can be maintained with high accuracy.

The film base 1 can be formed of, for example, polyimide, and the conductor wirings 2, the auxiliary conductor wiring 10, the bump electrodes 3 and the auxiliary bump electrode 11 can be formed of, for example, copper. The conductor wirings 2 in a region without the solder resist layer 5 and the bump electrodes 3 are provided with a metal plating layer made of an Au plating, an Sn plating or the like.

Embodiment 2

Figure 2A:
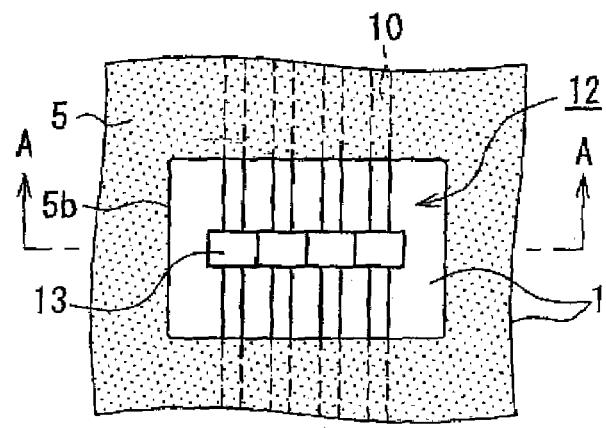
FIG. 2A is a plan view showing part of a wiring board according to Embodiment 2 of the present invention.
Figure 2B:
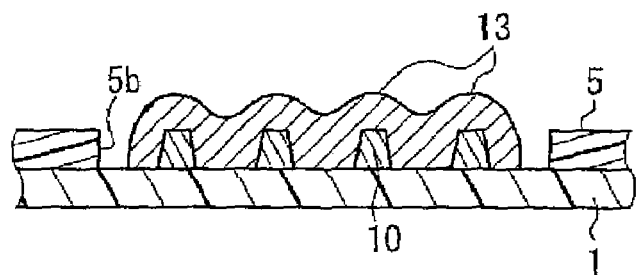
FIG. 2B is a sectional view taken along a line A-A in FIG. 2A.

Referring to FIG. 2, a wiring board according to Embodiment 2 of the present invention will be described. FIG. 2A is a plan view showing a main part of the wiring board in the present embodiment, and FIG. 2B is a sectional view taken along a line A-A in FIG. 2A. The same elements as those of the wiring board shown in FIG. 1 are assigned the same reference numerals, and the description thereof will not be repeated.

FIG. 2A shows a region of the register mark opening 5b provided in the solder resist layer 5 on the film base 1. In the present embodiment, a plurality of the auxiliary conductor wirings 10 are arranged in parallel. A register mark 12 is formed of auxiliary bump electrodes 13 that are aligned respectively in parallel with the plurality of the auxiliary conductor wirings 10.

By providing the plurality of auxiliary bump electrodes 13 as described above, an overall dimension of the register mark 12 increases. This brings about a larger variation in a contrast in an image recognition at the time of registration, so that an accuracy of the recognition improves, resulting in higher registration accuracy.

As shown in FIG. 2B, the adjacent auxiliary bump electrodes 13 are joined with each other. However, depending on conditions, the adjacent auxiliary bump electrodes 13 also may be spaced away from each other.

Embodiment 3

Figure 3:
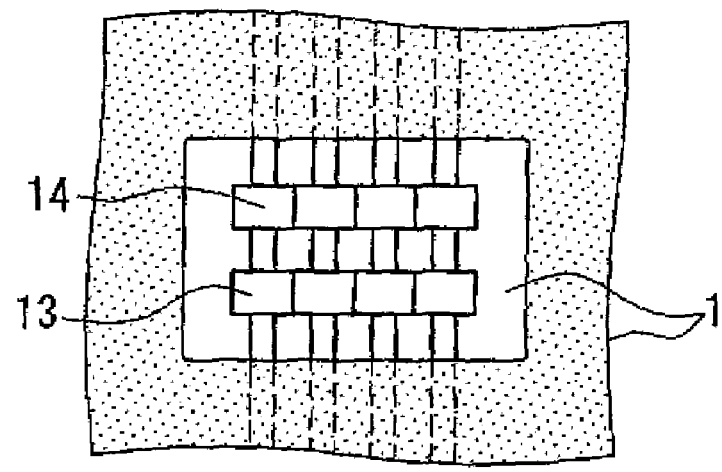
FIG. 3 is a plan view showing part of a wiring board according to Embodiment 3 of the present invention.

Referring to FIG. 3, a wiring board according to Embodiment 3 of the present invention will be described. FIG. 3 is a plan view showing a main part of the wiring board in the present embodiment, and shows a region of the register mark opening 5b provided in the solder resist layer 5 on the film base 1. The same elements as those of the wiring board shown in FIG. 2 are assigned the same reference numerals, and the description thereof will not be repeated.

The present embodiment is characterized in that another group of a plurality of auxiliary bump electrodes 14 is added to the configuration shown in FIG. 2. The auxiliary bump electrodes 14 are provided on the plurality of auxiliary conductor wirings 10 so as to be aligned in series with the auxiliary bump electrodes 13 that are aligned in parallel.

By adding the auxiliary bump electrodes 14 that are aligned in series with the auxiliary bump electrodes 13, the overall dimension of the register mark increases further. This improves the accuracy of the image recognition at the time of registration, resulting in still higher registration accuracy.

Embodiment 4

Figure 4:
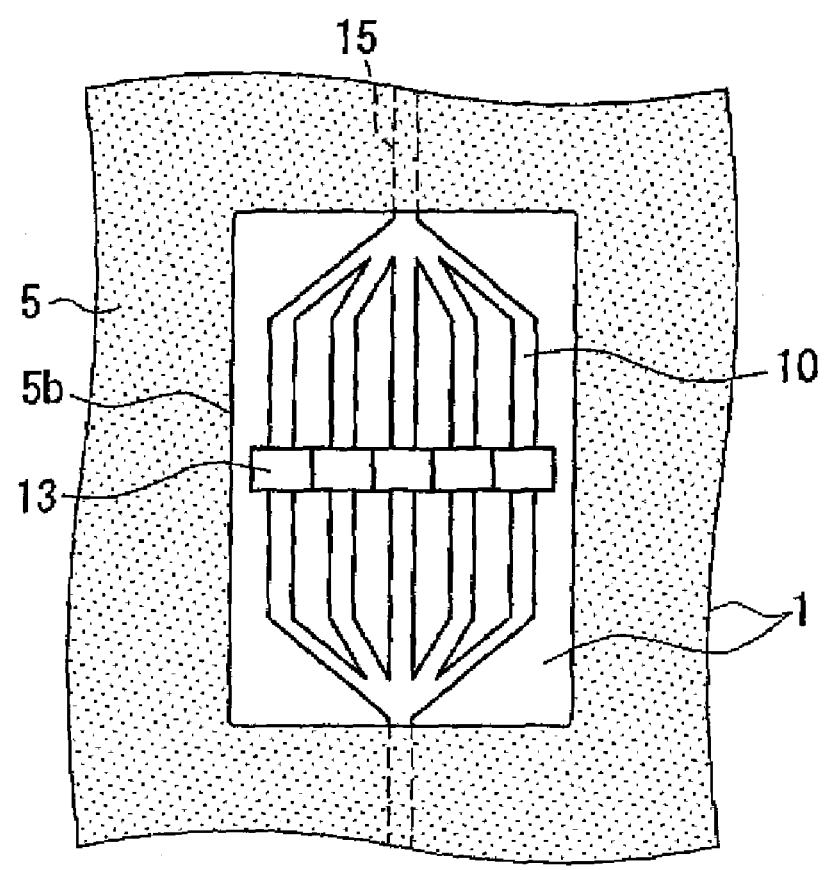
FIG. 4 is a plan view showing part of a wiring board according to Embodiment 4 of the present invention.

Referring to FIG. 4, a wiring board according to Embodiment 4 of the present invention will be described. FIG. 4 is a plan view showing a main part of the wiring board in the present embodiment, and shows a region of the register mark opening 5b provided in the solder resist layer 5 on the film base 1. The same elements as those of the wiring board shown in FIG. 2 are assigned the same reference numerals, and the description thereof will not be repeated.

The present embodiment is characterized in that the plurality of auxiliary conductor wirings 10 are combined into a single auxiliary conductor wiring 15 in regions on both sides of the auxiliary bump electrodes 13, unlike the configuration shown in FIG. 2. The plurality of auxiliary conductor wirings 10 are combined inside the register opening 5b, so that the auxiliary conductor wiring 15 crosses the perimeter edge of the register opening 5b.

As described above, the register mark formed inside the register opening 5b is formed of a combination of the plurality of auxiliary bump electrodes 13 and the single auxiliary conductor wiring 15. Because of the large variation in the contrast between the plurality of auxiliary bump electrodes 13 and the single auxiliary conductor wiring 15 in the image recognition at the time of registration, the recognition accuracy improves, resulting in higher registration accuracy.

Embodiment 5

Figure 5A:
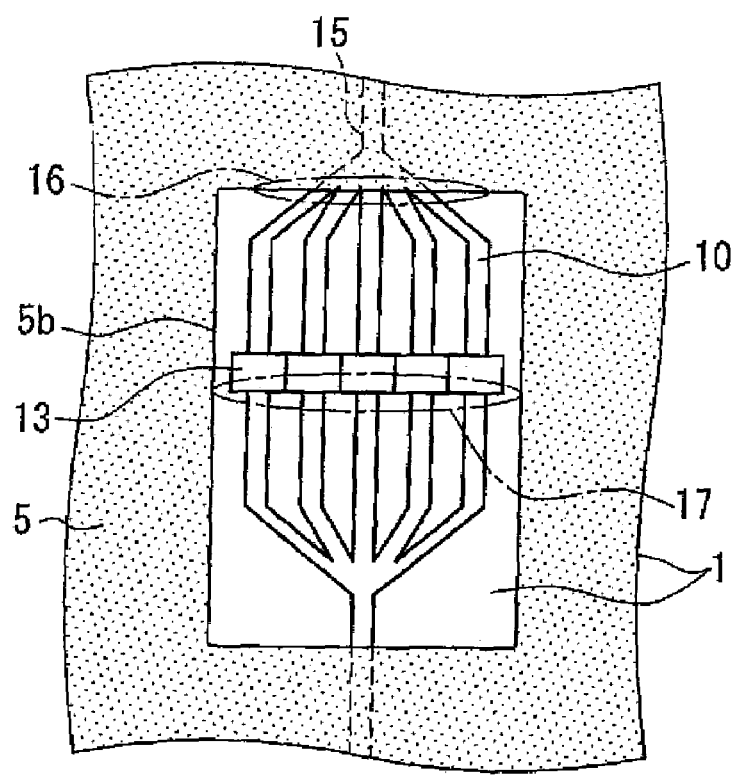
FIG. 5A is a plan view showing part of a wiring board according to Embodiment 5 of the present invention.
Figure 5B:
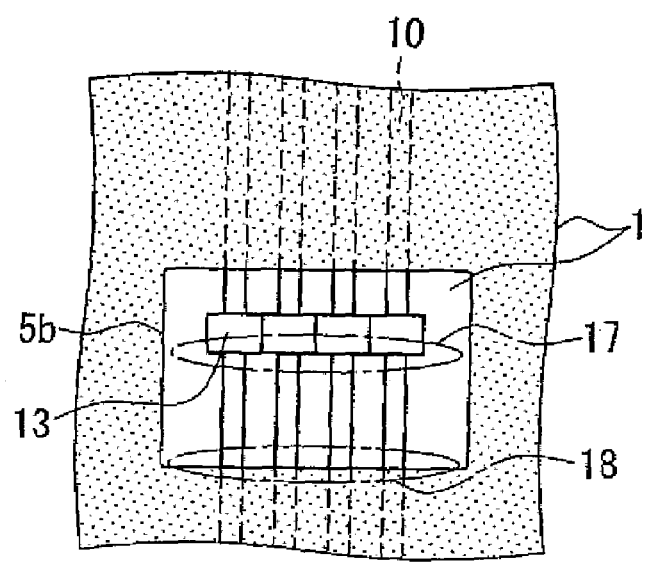
FIG. 5B is a plan view showing part of a wiring board in a comparative example.

Referring to FIGS. 5A and 5B, a wiring board according to Embodiment 5 of the present invention will be described. FIG. 5A is a plan view showing a main part of the wiring board in the present embodiment, and shows a region of the register mark opening 5b provided in the solder resist layer 5 on the film base 1. FIG. 5B shows the configuration of Embodiment 2 for comparison, which is the same as the wiring board shown in FIG. 2.

The present embodiment is a variation example of Embodiment 4 illustrated by FIG. 4. In other words, although the plurality of auxiliary conductor wirings 10 are combined into the single auxiliary conductor wiring 15 in regions on both sides of the auxiliary bump electrodes 13, the plurality of auxiliary conductor wirings 10 on one side are combined outside the register opening 5b. Thus, part of the auxiliary conductor wirings 10 have an oblique crossing portion 16 in which they cross the perimeter edge of the register opening 5b obliquely.

Since the auxiliary conductor wirings 10 have the oblique crossing portion 16 as described above, a variation in the contrast becomes larger between the oblique crossing portion 16 and a straight portion 17 of the auxiliary conductor wirings 10 near the auxiliary bump electrodes 13 in the image recognition at the time of registration. Accordingly, the recognition accuracy improves, resulting in higher registration accuracy. In contrast, in the case of the configuration shown in FIG. 5B, the auxiliary conductor wirings 10 have a crossing portion 18 in which they cross the perimeter edge of the register opening 5b perpendicularly. Thus, the variation in the contrast in the image recognition between the crossing portion 18 and the straight portion 17 of the auxiliary conductor wirings 10 is not as large.

For example, the auxiliary conductor wirings 10 may have a pitch of 30 to 100 μm and a width of 15 to 50 μm, and the auxiliary bump electrodes 13 may have a width of 20 to 50 μm, a height of 10 to 30 μm and a length of 20 to 50 μm.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A wiring board comprising:
a flexible insulating base;
a plurality of conductor wirings aligned on the flexible insulating base; and
bump electrodes provided respectively in end portions of the plurality of conductor wirings in a region where a semiconductor chip is to be placed;
the wiring board being configured so that the semiconductor chip is mounted on the conductor wirings by bonding electrode pads formed on the semiconductor chip to the bump electrodes;
wherein an auxiliary conductor wiring is formed on the insulating base, an auxiliary bump electrode is formed on the auxiliary conductor wiring, and a solder resist layer is formed so as to coat the insulating base including the conductor wirings and the auxiliary conductor wiring,
a plurality of the auxiliary conductor wirings are arranged in parallel, the auxiliary bump electrodes arc formed respectively on the plurality of the auxiliary conductor wirings so as to be aligned in parallel with each other, and the auxiliary bump electrodes that are adjacent to each other are joined,
the solder resist layer has a register opening in an end region of the auxiliary conductor wiring where the auxiliary bump electrode is formed, and the auxiliary bump electrode is exposed from the register opening, so that a register mark is formed of the plurality of the auxiliary bump electrodes in the register opening, and
the electrode pads formed on the semiconductor chip can be registered with respect to the bump electrodes on the conductor wirings by positioning the semiconductor chip through image recognition with reference to the register mark.

2. The wiring board according to claim 1, wherein the bump electrodes and the auxiliary bump electrode have equal heights.

3. The wiring board according to claim 1, wherein a material of the bump electrodes and a material of the auxiliary bump electrode are the same.

4. The wiring board according to claim 1, wherein the auxiliary bump electrode is disposed in an. outer region spaced away from a region where the bump electrode is disposed.

5. The wiring board according to claim 1, wherein another group of a plurality of auxiliary bump electrodes are provided on the plurality of the auxiliary conductor wirings so as to be aligned in series with the auxiliary bump electrodes that are aligned in parallel.

6. The wiring board according to claim 1, wherein the plurality of the auxiliary conductor wirings are joined into a single auxiliary conductor wiring in regions on both sides of the auxiliary bump electrodes, and a portion of the joint is located inside the register opening, so that a register mark is formed of a combination of the plurality of the auxiliary bump electrodes and the single auxiliary conductor wiring in the register opening.

7. The wiring board according to claim 1, wherein the plurality of the auxiliary conductor wirings are joined into a single auxiliary conductor wiring in regions on both sides of the auxiliary bump electrodes, and at least pan of the plurality of the auxiliary conductor wirings have an oblique crossing portion in which they cross a perimeter edge of the register opening obliquely, so that a register mark is formed of a combination of the plurality of the auxiliary bump electrodes and the oblique crossing portion of the auxiliary conductor wiring in the register opening.

8. The wiring board according to claim 1, wherein the plurality of the auxiliary conductor wirings are combined into a single auxiliary conductor wiring in regions on both sides of the auxiliary bump electrodes, and at least part of the plurality of the auxiliary conductor wirings have a crossing portion in which they cross a perimeter edge of the register openings so that a register mark is formed of a combination of the plurality of die auxiliary bump electrodes and the crossing portion of the auxiliary conductor wiring in the register opening.

9. A wiring board comprising:
a flexible insulating base;
a plurality of conductor wirings aligned on the flexible insulating base; and
bump electrodes provided respectively in end portions of the plurality of conductor wirings in a region where a semiconductor chip is to be placed;
the wiring board being configured so tat the semi conductor chip is mounted on the conductor wirings by bonding electrode reds formed on the semiconductor chip to the bump electrodes;
wherein an auxiliary conductor wiring is formed on the insulating base, an auxiliary bump electrode is formed on the auxiliary conductor wiring, and a solder resist layer is formed so as to coat the insulating base including the conductor wirings and the auxiliary conductor wiring,
a plurality of the auxiliary conductor wirings are arranged in parallel, the auxiliary bump electrodes are formed respectively on the plurality of the auxiliary conductor wirings so as to be aligned in parallel with each other, and the auxiliary bump electrodes that are adjacent to each other are spaced away,
the solder resist layer has a register opening in an end region of the auxiliary conductor wiring where the auxiliary bump electrode is formed, and the auxiliary bump electrode is exposed from the register opening, so that a register mark is formed of the plurality of the auxiliary bump electrodes in the register opening, and
the electrode pads formed on the semiconductor chip can be registered with respect to the bump electrodes on the conductor wirings by positioning the semiconductor chip through image recognition with reference to the register mark.

10. The wiring board according to claim 9, wherein another group of a plurality of auxiliary bump electrodes are provided on the plurality of the auxiliary conductor wirings so as to be aligned in series with the auxiliary bump electrodes that are aligned in parallel.

11. The wiring board according to claim 9, wherein the plurality of the auxiliary conductor wirings are joined a single auxiliary conductor wiring in regions on both sides of the auxiliary bump electrodes, and a portion of the joint is located inside the register opening, so that a register mark is formed of a combination of the plurality of the auxiliary bump electrodes and the single, auxiliary conductor wiring in the register opening.

12. The wiring board according to claim 9, wherein the plurality of the auxiliary conductor wirings are joined into a single auxiliary conductor wiring in religions on both sides of the auxiliary bump electrodes, and at least part of the plurality of the auxiliary conductor wirings have an oblique crossing portion in which they cross a perimeter edge of the register opening obliquely, so that a register mark is formed of a combination of the plurality of auxiliary bump electrodes and the oblique crossing portion of the auxiliary conductor wiring in the register opening.

13. The wiring board according to claim 9, wherein the bump electrodes and the auxiliary bump electrode have equal heights.

14. The wiring board according to claim 9, wherein a material of the bump electrodes and a material of the auxiliary bump electrode are the same.

15. The wiring board according to claim 9, wherein the auxiliary bump electrode is disposed in an outer region spaced away from a region where the bump electrode is disposed.

16. The wiring board according to claim 9, wherein the plurality of the auxiliary conductor wirings are combined into a single auxiliary conductor wiring in regions on both sides of the auxiliary bump electrodes, and at least part of the plurality of the auxiliary conductor wirings have a crossing portion in which they cross a perimeter edge of the register opening, so that a register mark is formed of a combination of the plurality of the auxiliary bump electrodes and the crossing portion of the auxiliary conductor wiring in the register opening.

\* \* \* \* \*